United States Patent
Vandamme et al.

[11] Patent Number: 6,114,245
[45] Date of Patent: Sep. 5, 2000

[54] METHOD OF PROCESSING SEMICONDUCTOR WAFERS

[75] Inventors: Roland Vandamme, St. Charles; Yun-Biao Xin; Zhijian Pei, both of St. Peters, all of Mo.

[73] Assignee: MEMC Electronic Materials, Inc., St. Peters, Mo.

[21] Appl. No.: 09/356,616

[22] Filed: Jul. 19, 1999

Related U.S. Application Data

[63] Continuation of application No. 08/915,975, Aug. 21, 1997, abandoned.

[51] Int. Cl.[7] .......................... H01L 21/302; H01L 21/461
[52] U.S. Cl. ............................................. 438/690; 438/691
[58] Field of Search .................................. 438/690, 691, 438/692, 693; 216/89, 90, 52; 451/14

[56] References Cited

U.S. PATENT DOCUMENTS

| | | | |
|---|---|---|---|
| 4,054,010 | 10/1977 | Shipman | 51/55 |
| 4,144,099 | 3/1979 | Edmonds et al. | 148/1.5 |
| 4,149,343 | 4/1979 | Feldmeier | 51/133 |
| 4,276,114 | 6/1981 | Takano et al. | 156/645 |
| 4,318,250 | 3/1982 | Klievoneit et al. | 51/134 |
| 4,663,890 | 5/1987 | Brandt | 51/283 |
| 4,693,036 | 9/1987 | Mori | 51/131.3 |
| 4,753,049 | 6/1988 | Mori | 51/131.3 |
| 4,918,869 | 4/1990 | Kitta | 51/131.1 |

(List continued on next page.)

FOREIGN PATENT DOCUMENTS

| | | |
|---|---|---|
| 0 350 531 A2 | 1/1990 | European Pat. Off. . |
| 0 460 437 A2 | 11/1991 | European Pat. Off. . |
| 0 534 108 A1 | 8/1992 | European Pat. Off. . |
| 0 588 055 A2 | 3/1994 | European Pat. Off. . |
| 0 617 456 A2 | 9/1994 | European Pat. Off. . |
| 0 617 457 A2 | 9/1994 | European Pat. Off. . |
| 0 628 992 A2 | 12/1994 | European Pat. Off. . |
| 0 388 972 B1 | 1/1996 | European Pat. Off. . |
| 0 699 504 A1 | 3/1996 | European Pat. Off. . |
| 0 764 976 A1 | 3/1997 | European Pat. Off. . |
| 0 847 835 A1 | 12/1997 | European Pat. Off. . |
| 0 823 308 A1 | 2/1998 | European Pat. Off. . |
| 0 850 724 A1 | 7/1998 | European Pat. Off. . |

OTHER PUBLICATIONS

Shapiro, M.K., et al., "A Process for Grinding And Polishing Single–Crystal Corundum Plates", Optical Technology, vol. 39, No. 10, p. 625, Oct., 1972.

Jensen, E.W., "Polishing Compound Semiconductors", Solid State Technology, pp. 49–52, Aug., 1973.

Nishiguchi, M., et al., "Mechanical Thinning of InP Wafer by Grinding", Journal Of The Electrochemical Society, pp. 1826–1831, vol. 138, No. 6, Jun. 1991.

PCT International Search Report, PCT/US98/16778, Nov. 27, 1998.

PCT International Search Report, PCT/US98/18214, Dec. 17, 1998.

"Fully Automatic In–Feed Surface Grinder DFG 840" product brochure by DISCO Corporation, no date.

"Fully Automatic Material Grinding With the G&N Nanogrinder/4–300" product brochure by G&N Genauigkeits Maschinenbau.

*Primary Examiner*—Benjamin L. Utech
*Assistant Examiner*—Duy-Vu Deo
*Attorney, Agent, or Firm*—Senniger, Powers, Leavitt & Roedel

[57] ABSTRACT

A method of processing a semiconductor wafer comprises rough grinding the front and back surfaces of the wafer to quickly reduce the thickness of the wafer. The front and back surfaces are then lapped with a lapping slurry to further reduce the thickness of the wafer and reduce damage caused by the rough grinding. Lapping time is reduced by provision of the rough grinding step. The wafer is etched in a chemical etchant to further reduce the thickness of the wafer and the front surface of the wafer is polished using a polishing slurry to reduce the thickness of the wafer down to a predetermined final wafer thickness. A fine grinding step may be added to eliminate lapping and/or reduce polishing time.

17 Claims, 4 Drawing Sheets

U.S. PATENT DOCUMENTS

| | | | |
|---|---|---|---|
| 4,927,432 | 5/1990 | Budinger et al. | 51/298 |
| 4,947,598 | 8/1990 | Sekiya | 51/283 |
| 5,035,087 | 7/1991 | Nishiguchi et al. | 451/14 |
| 5,113,622 | 5/1992 | Nishiguchi et al. | 51/165.73 |
| 5,189,843 | 3/1993 | Steere, Jr. | 51/165.76 |
| 5,227,339 | 7/1993 | Kishii | 438/459 |
| 5,329,733 | 7/1994 | Steere, Jr. | 51/165 |
| 5,360,509 | 11/1994 | Zakaluk et al. | 156/645 |
| 5,377,451 | 1/1995 | Leoni et al. | 451/287 |
| 5,400,548 | 3/1995 | Huber et al. | 451/41 |
| 5,429,711 | 7/1995 | Watanabe et al. | 438/692 |
| 5,439,551 | 8/1995 | Meikle et al. | 438/692 |
| 5,500,047 | 3/1996 | Park et al. | 118/724 |
| 5,527,030 | 6/1996 | Kubo et al. | 51/309 |
| 5,545,076 | 8/1996 | Yun et al. | 451/287 |
| 5,549,502 | 8/1996 | Tanaka et al. | 451/8 |
| 5,571,373 | 11/1996 | Krishna et al. | 438/693 |
| 5,651,724 | 7/1997 | Kimura et al. | 451/41 |
| 5,849,636 | 12/1998 | Harada et al. | 438/691 |
| 5,851,924 | 12/1998 | Nakazawa et al. | 438/691 |
| 5,882,539 | 3/1999 | Hasegawa et al. | 438/690 |

001
METHOD OF PROCESSING SEMICONDUCTOR WAFERS

This is a continuation of application Ser. No. 08/915,975, filed Aug. 21, 1997, abandoned.

BACKGROUND OF THE INVENTION

The present invention relates generally to a method of processing semiconductor wafers, and, more particularly, to a method of processing semiconductor wafers in which the wafer is subjected to one or more grinding operations.

Semiconductor wafers are generally prepared from a single crystal ingot, such as a silicon ingot, which is trimmed and ground to have one or more flats for proper orientation of the wafer in subsequent procedures. The ingot is then sliced into individual wafers which are each subjected to a number of processing operations to reduce the thickness of the wafer, remove damage caused by the slicing operation, and to create a highly reflective surface. In conventional wafer shaping processes, the peripheral edge of each wafer is rounded to reduce the risk of wafer damage during further processing. A lapping operation is then performed on the front and back surfaces of the wafer using an abrasive slurry (lapping slurry) and a set of rotating lapping plates. The lapping operation reduces the thickness of the wafer to remove surface damage induced by the slicing operation and to make the opposing side surfaces of each wafer flat and parallel. However, conventional lapping operations are relatively time consuming. For example, a typical lapping operation for wafers having diameters ranging from 200 mm to 300 mm, used to reduce the thickness by about 80 microns, will take approximately 40 minutes to complete.

Upon completion of the lapping operation, the wafers are subjected to a chemical etching operation to further reduce the thickness of the wafer and remove mechanical damage produced by the prior processing operations. One side surface of each wafer (often referred to as the "front" side of the wafer) is then polished using a polishing pad, a colloidal silica slurry (polishing slurry) and a chemical etchant to ensure that the wafer has a highly reflective, damage-free surface. The wafers are typically polished using a two step method of rough polishing for stock removal followed by finish polishing to reduce nonspecularly reflected light (haze). A typical polishing process for wafers having diameters ranging from 200 mm–300 mm reduces the thickness of the wafer by about 10–15 microns and takes approximately 5–15 minutes to complete. A smoother surface may be obtained by including an intermediate polishing operation in which case the entire polishing process takes 30–40 minutes to complete.

The wafers are then cleaned and inspected prior to delivery to the customer for dicing the wafer into semiconductor chips. The wafers must be of sufficient thickness to reduce the risk of surface damage or wafer breakage during packaging and transport. Before cutting the wafer into chips, the wafer is subjected to a conventional backside grinding operation in which the front side of the wafer is covered by a protective covering and laid face down on a table, and the back side of the wafer is ground by a suitable grinding apparatus to substantially reduce the thickness of the wafer.

The conventional method of processing a semiconductor wafer described above, though effective, requires substantial time to complete and also involves significant processing materials cost. The grits used in the lapping and polishing slurries are expensive, and the complexity of the various apparatus used for controlling the slurries and the lapping and polishing pads increases the difficulty in automating the wafer shaping process. In addition, the lapping and polishing operations require considerable time for reducing the thickness of the wafer.

To reduce the processing time, it is known to subject the wafer to a grinding operation in which a rotating grinding wheel having an abrasive surface directly contacts the wafer, without the need for a grit based slurry. The grinding wheel is rotated at high speeds and placed in direct contact with the wafer to grind down the thickness of the wafer. The grinding wheel may be infed into contact with the wafer or the wafer may be infed into contact with the grinding wheel. Water is used during the grinding operation to continually cool the grinding wheel and wafer and remove the silicon swarf.

However, rough grinding operations generally cause deeper crystal lattice damage to the wafer than lapping and polishing operations, resulting in a lesser quality wafer and an increased risk of fracturing of the wafer.

SUMMARY OF THE INVENTION

Among the several objects of this invention may be noted the provision of a method for processing a semiconductor wafer sliced from a single-crystal ingot that reduces the processing time for shaping each wafer; the provision of such a process which increases the flatness of the wafer; the provision of such a process which is economical for use in processing wafers; and the provision of such a process which is easier to automate.

Generally, a method of the present invention for processing a semiconductor wafer sliced from a single-crystal ingot and having front and back surfaces and a peripheral edge comprises rough grinding the front and back surfaces of the wafer to quickly reduce the thickness of the wafer. The front and back surfaces of the wafer are lapped using a lapping slurry to further reduce the thickness of the wafer and reduce damage caused by the rough grinding. The wafer is etched in a chemical etchant to further reduce the thickness of the wafer and front surface of the wafer is polished using a polishing slurry to reduce the thickness of the wafer down to a predetermined wafer thickness.

In another embodiment of the present invention, a method of processing a semiconductor wafer comprises rough grinding the surfaces of the front and back of the wafer to quickly reduce the thickness of the wafer. The front surface of the wafer is subjected to fine grinding to further reduce the thickness of the wafer and reduce wafer damage caused by the rough grinding. The front surface of the wafer is polished using a polishing slurry.

In yet another embodiment, a method of processing a semiconductor wafer comprises fine grinding the front and back surfaces of the wafer to quickly reduce the thickness of the wafer, followed by polishing the front surface of the wafer using a polishing slurry.

Other objects and advantages of the invention will be apparent from the following detailed description.

DETAILED DESCRIPTION OF THE PREFERRED EMBODIMENTS

Figure 1:
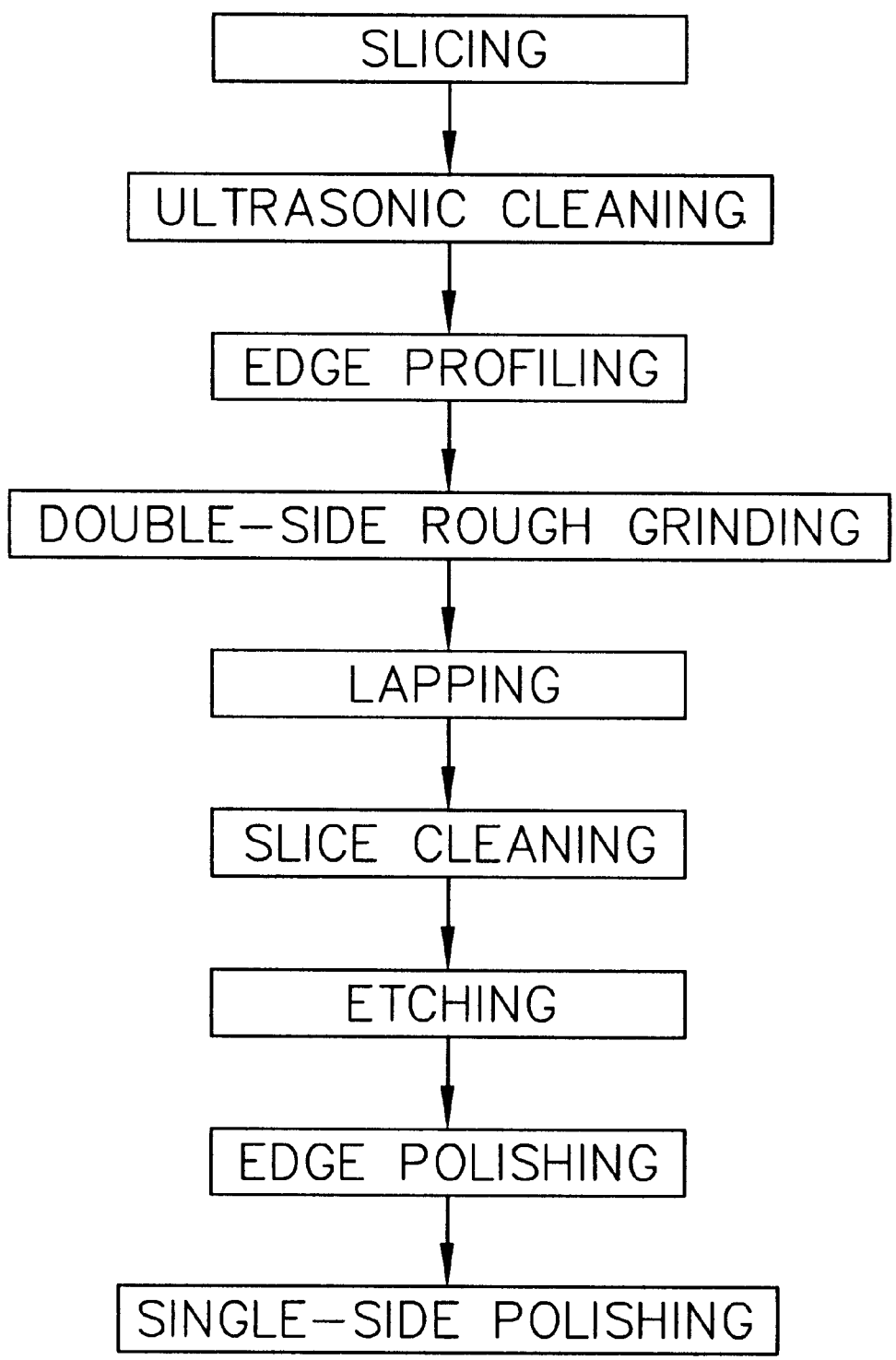
FIG. 1 is a flow diagram of a first embodiment of a method of the present invention for processing a semiconductor wafer.

Applicants have discovered that the several objects of the invention can be obtained by subjecting the wafers to a combination of grinding, lapping and polishing operations. While the method of the present invention is illustrated and described herein with reference to semiconductor wafers constructed of silicon, it is understood that the method is applicable to processed wafers, discs or the like constructed of other materials without departing from the scope of this invention. FIG. 1 illustrates a preferred method of processing a semiconductor wafer in which the conventional lapping operation is partially replaced with a double-side rough grinding operation. The semiconductor wafer is sliced from a single-crystal ingot, such as by using a conventional inner diameter saw or conventional wire saw, to have a predetermined initial thickness. The sliced wafer is generally disk-shaped and has a peripheral edge and opposing front and back surfaces. The initial thickness of each wafer is substantially greater than the desired end thickness to allow subsequent processing operations to reduce the thickness of the wafer without the risk of damaging or fracturing the wafer. As an example, the initial thickness may be in the range of about 800–1200 microns.

After slicing, the wafer is subjected to ultrasonic cleaning to remove particulate matter deposited on the wafer from the slicing operation. The peripheral edge of the wafer is profiled (e.g. rounded) by a conventional edge grinder (not shown) to reduce the risk of damage to the wafer during further processing. The wafer is then placed in a grinding apparatus (not shown) for rough grinding the front and back surfaces to quickly reduce the thickness of the wafer. The grinding apparatus for the rough grinding operation is preferably of the type which employs a circumferential grinding technique. A preferred grinding apparatus is manufactured by Genauigkeits Maschinenbau Nurnberg GmbH under the trade name NANOGRIDER/4-300. This apparatus includes a pair of grinding wheels attached to respective motor driven spindles that rotate the grinding wheels and are capable of being moved up and down on a vertical axis. The wafer is drawn by vacuum against a chuck of a support table with one surface of the wafer lying against the chuck and the opposite surface facing one of the grinding wheels in opposed relationship.

As the grinding wheel is rotated by the motor driven spindle, the spindle is lowered along its vertical axis into contact with the wafer to grind down the surface of the wafer. The vertical axis of the spindle is offset from the center of the wafer so that only a peripheral portion of the grinding wheel contacts the wafer. While the grinding wheel is in contact with the wafer, the wafer rotates around its center to assure uniform grinding of the front surface of the wafer. After rough grinding the front surface, the apparatus flips the wafer over and moves the wafer to a position opposing the second spindle and grinding wheel for rough grinding the back surface of the wafer. It is to be understood that a grinding apparatus having only a single spindle and grinding wheel may be used for the rough grinding operation without departing from the scope of the invention.

The grinding wheel used in the grinding apparatus is a resin bond type grinding wheel known to those skilled in the art as comprising a resin matrix impregnated with grains of suitable size and material, such as diamond fragments, for grinding silicon. For the rough grinding operation, the average size of the grains are preferably in the range of 5 to 35 microns. The grinding wheels are rotated by the spindles at high speeds (otherwise referred to as the spindle speed) of between 2500 and 3500 rpm. The rate at which the spindles are infed toward the wafer for grinding down the wafer thickness (otherwise referred to as the grinding speed) is in the range of about 50 to 250 microns per minute. This rate is substantially faster than for a conventional lapping operation, which is generally less than 10 microns per minute and more typically about 2 to 2.5 microns per minute. Thus, the rough grinding operation substantially reduces the amount of time required to reduce the thickness of the wafer in comparison to a lapping operation.

As an example, for 300 mm diameter wafers cut from a crystal ingot to have an initial thickness of about 900–910 microns, the double-side rough grinding operation is conducted to reduce the thickness of the wafer by about 45–75 microns. The total time required for the rough grinding step is about 30–60 seconds. In comparison, using conventional lapping operations it would take about 25–30 minutes to reduce the thickness by 55 microns. 200 mm wafers having an initial wafer thickness in the range of 860–880 microns are also reduced in thickness by about 45–75 microns by the double-side rough grinding operation of the present invention. It is also contemplated that wafers of a size other than 200 mm and 300 mm may be processed using double-side rough grinding without departing from the scope of this invention.

Once the rough grinding operation is completed, the wafer is subjected to a conventional lapping operation to further reduce the thickness of the wafer and to flatten and parallel its opposing side surfaces. Reduction of the thickness via the lapping operation also removes damage caused by the wafer slicing and rough grinding operations. Up to 20–25 wafers may be placed in a lapping apparatus after being subjected to the rough grinding operation. About 25 microns of thickness is then removed from each of the wafers by the lapping operation. This preferred thickness reduction is applicable to both 200 mm and 300 mm wafers. The lapping operation takes about 10 minutes to complete. Therefore, upon completion of the lapping operation, a total of about 80 microns of thickness has been removed from the wafer in just under 11 minutes, not including handling time. In comparison, prior processes in which a lapping operation is performed to reduce the thickness by about 80 microns take about 40 minutes to complete.

After the lapping operation, the wafers are cleaned and subjected to a chemical etching operation to remove additional thickness (e.g. about 15–25 microns), from the wafer. Finally, the wafer is edge polished and subjected to conventional polishing operations on at least the front surface to provide a highly reflective, damage free surface of the wafer. As described herein, the method of the present invention processes the wafer up to and including the polishing operation, at which point the wafer is cleaned, packaged and delivered to a customer. The wafer is still of sufficient thickness to reduce the risk of damage or wafer breakage during packaging and transport. For example, the 200 mm wafers have been reduced to a thickness of about 720–730 microns and the 300 mm wafers have been reduced to a thickness of about 770–780 microns. The back surface of the wafer will subsequently be subjected to a conventional backside grinding operation (i.e., placing a protective covering over the finished front surface of the wafer and lying the front surface face down on a table while the back surface is subjected to grinding) to sufficiently reduce the thickness of the wafer to permit the wafer to be diced into small semiconductor chips.

Figure 2:
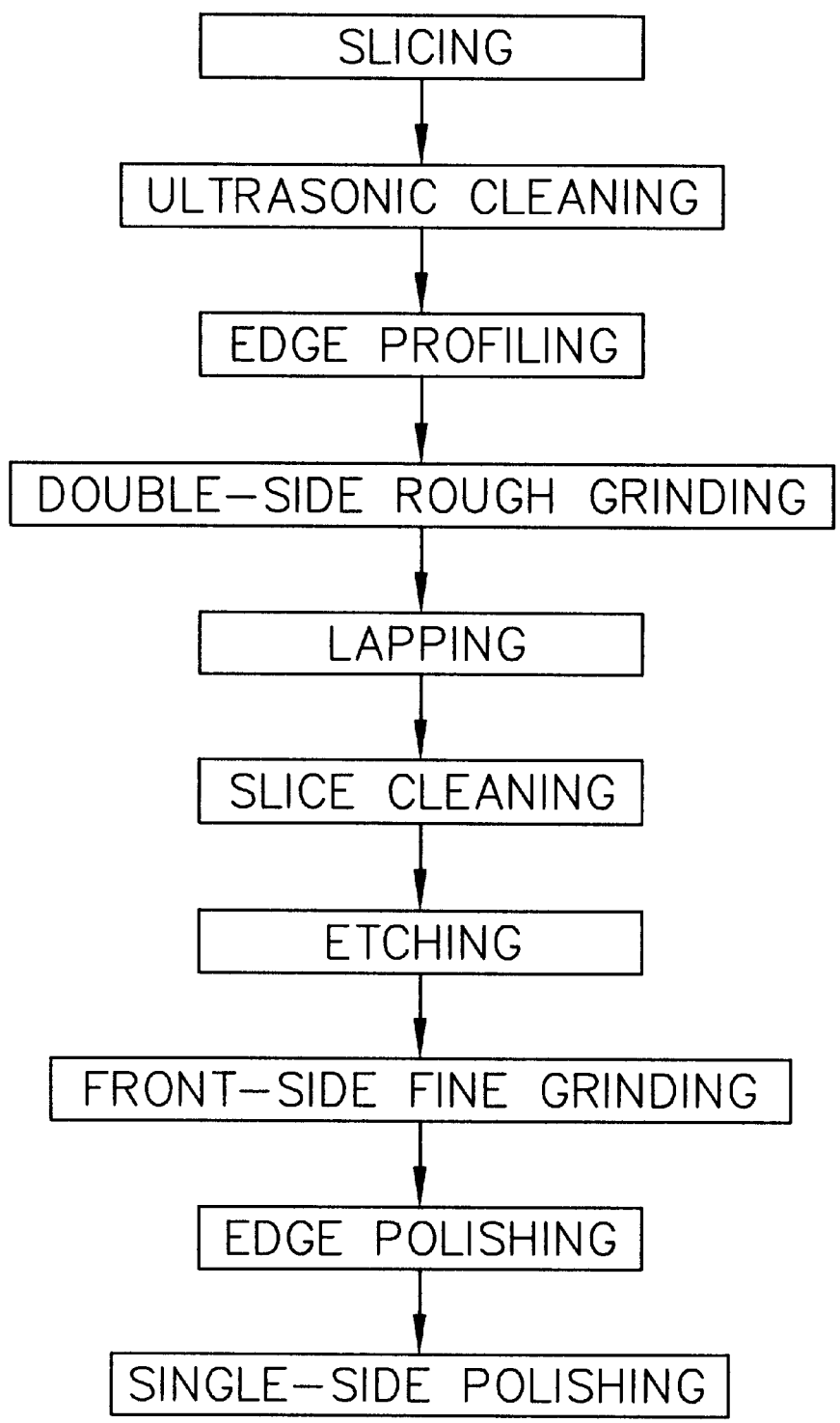
FIG. 2 is a flow diagram of a second embodiment of a method of the present invention for processing a semiconductor wafer.

FIG. 2 illustrates a second embodiment of the method of the present invention in which a fine grinding operation is performed after the etching operation, before the polishing operation. The wafer is sliced from the single-crystal ingot and processed according to the method of the first embodiment up through the etching operation, including the double-side rough grinding operation to quickly reduce the thickness of the wafer. Those skilled in the art will recognize that the etching operation can negatively effect the flatness of the wafer. Therefore, upon completion of the etching operation, the wafer is placed in a fine grinding apparatus in which one side surface of the wafer (again referred to as the front side) is subjected to a fine grinding operation to further reduce thickness and improve flatness without causing further significant damage to the wafer.

The fine grinding apparatus is preferably a conventional circumferential grinding apparatus that uses a resin bond type grinding wheel similar to that used for the rough grinding operation. A preferred fine grinding apparatus is manufactured by Disco Corporation under the tradename DFG 840. For the fine grinding operation, the grains impregnated into the resin matrix of the grinding wheel have an average size in the range of 2 to 10 microns (i.e., substantially smaller than those used for rough grinding), and more preferably in the range of 2 to 6 microns. The spindle speed of the grinding wheel is between 2500 and 5000 rpm and the infeed rate of the spindle (e.g. grinding speed) is about 15–20 microns per minute. The fine grinding operation quickly removes a small amount of thickness, such as 5–10 microns, from the wafer to further flatten and parallel the wafer before the polishing operation. The fine grinding operation takes about 2 minutes to complete. It is understood that the fine grinding operation may also be performed on the back surface of the wafer without departing from the scope of this invention.

Once the fine grinding operation is completed, the front surface of the wafer is subjected to a conventional polishing operation to remove an additional small amount of thickness, such as 5–15 microns, and remove any remaining damage caused by prior processing operations. In comparison, conventional wafer processing uses the polishing operation to remove 10–15 microns of thickness. Therefore, by subjecting the wafer to the fine grinding operation, the time required for polishing the wafer is reduced by up to one-half the time previously required, not including handling time. After the polishing operation, the thickness of the wafer has been reduced to a thickness substantially the same as that previously described with respect to the method of the first embodiment, and is ready for packaging and transporting to the customer.

Figure 3:
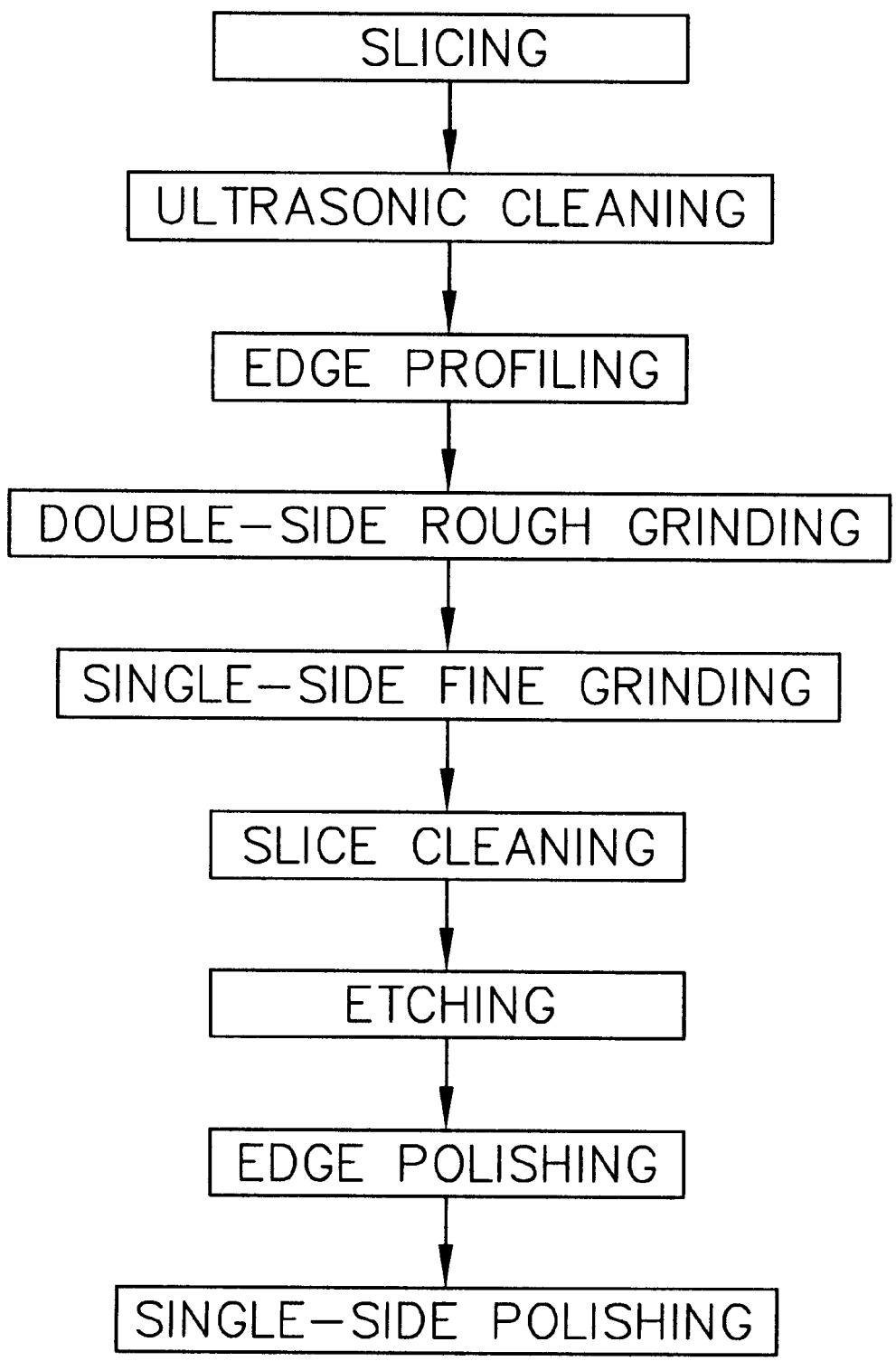
FIG. 3 is a flow diagram of a first embodiment of a method of the present invention for processing a semiconductor wafer.

FIG. 3 illustrates a third embodiment of the present process in which the fine grinding operation is performed on the front surface of the wafer after the double-side rough grinding operation and prior to the etching operation.

Figure 4:
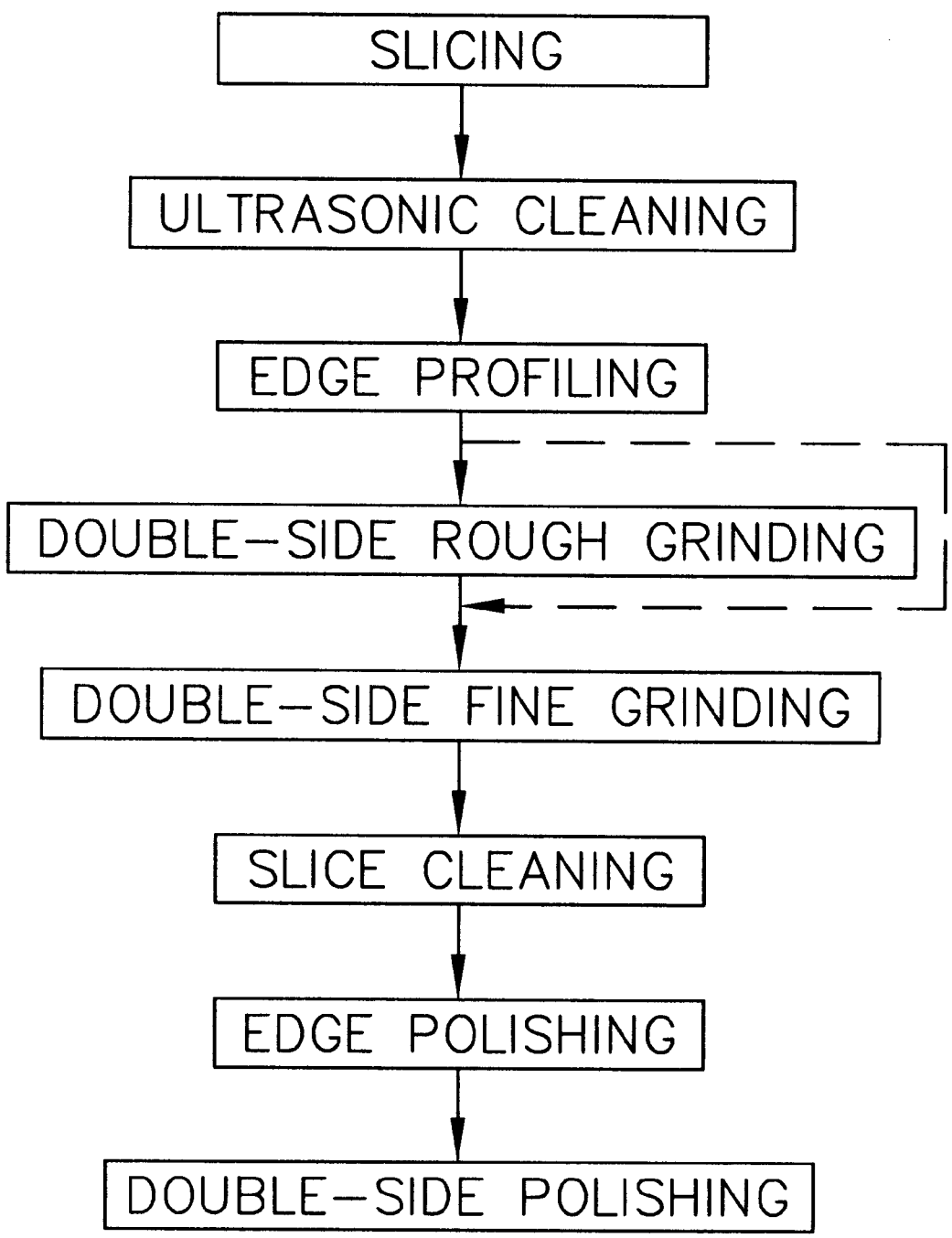
FIG. 4 is a flow diagram of a second embodiment of a method of the present invention for processing a semiconductor wafer.

FIG. 4 illustrates a fourth embodiment of the present process in which the rough grinding and fine grinding operations replace the chemical etching operation. After the wafer is sliced from the single-crystal ingot, the wafer is processed according to the method of the first embodiment up to and including the double-side rough grinding operation. After the rough grinding operation, the front and back surfaces of the wafer are subjected to the fine grinding operation. The double-side fine grinding operation removes sufficient mechanical damage of the wafer caused by the rough grinding operation so that the etching operation is not required. After the double-side fine grinding operation is completed, the wafers are cleaned, edge polished and both side surfaces of the wafer are subjected to a polishing operation. As illustrated by the dotted line in FIG. 4, it is contemplated that the double-side rough grinding operation may be omitted so that the wafer is subjected only to the double-side fine grinding operation and remain within the scope of this invention.

EXAMPLE I

Fifty silicon semiconductor wafers, each having a diameter of 200 mm, were processed according to the method illustrated in FIG. 1 and described above. The double-side rough grinding operation was performed to remove approximately 55 microns (22.5 microns on each of the front and back surfaces) of material from the wafer, taking a total of approximately 40 seconds to complete. Upon completion of the grinding operation, the total thickness variation (hereinafter referred to as TTV, which is the difference between the maximum and minimum values of thickness encountered in the wafer) was measured. The average TTV of the wafers tested was less than 2 microns. The wafers were then subjected to the lapping operation to remove an additional 25 microns of thickness from the wafer, taking approximately 10 minutes to complete. After the lapping operation, the average TTV value of the wafers was measured to be less than 1 micron. The wafers are then subjected to the conventional etching, edge polishing and side surface polishing operations to complete the processing of the wafers.

For comparison purposes, conventional reduction of thickness by 80 microns using only the lapping operation takes approximately 40 minutes to complete and yields TTV values in the range of 1.5–2.0 microns.

EXAMPLE II

Fifty silicon semiconductor wafers, each having a diameter of 200 mm, were processed according to the method illustrated in FIG. 2 and described above. The average TTV value of the wafers was measured after the etching operation to be less than 1.5 microns. The front surface of each wafer was subjected to the fine grinding operation to reduce the wafer thickness by approximately 5–15 microns over a time period of about 2 minutes. Upon completion of the fine grinding operation, the average TTV value of the wafers was measured to be less than 1 micron. The wafers were then subjected to the polishing operation to remove an additional 5 microns of material from the front surface of the wafer over a time period of about 5 minutes, after which the average TTV value of the wafers was measured to be less than 0.7 microns.

For comparison purposes, the average TTV value of wafers processed according to conventional processes involving lapping and polishing operations is about 1.5–2.0 microns.

EXAMPLE III

Fifty silicon semiconductor wafers, each having a diameter of 300 mm, were processed according to the method illustrated in FIG. 4 and described above. Each of the wafers was subjected to both the double-side rough grinding and double side fine-grinding operations, omitting the etching operation. After cleaning, the wafers were then subjected to a double-side polishing operation and the TTV value of each wafer was measured. The average TTV value of the fifty wafers tested was less than 2.5 microns. As with the second embodiment, the time required for the polishing operation is reduced by preceding the polishing operation with the fine grinding operation.

In view of the above, it will be seen that the several objects of the invention are achieved and other advantageous results attained. By partially replacing the prior lapping operations with a combination of rough grinding and lapping operations, the processing time for wafers is substantially reduced while improving the flatness. Wafer damage is also substantially reduced with respect to prior grinding only operations. In addition, the grinding wheels used for rough grinding and fine grinding are substantially less costly than the grit based lapping and polishing slurries. Reducing the amount of lapping and polishing performed on the wafer results in substantial savings over prior lapping and polishing only operations.

While the invention is susceptible to various modifications and alternative forms, specific embodiments thereof have been shown by way of example and were herein described in detail. It should be understood, however, that it is not intended to limit the invention to the particular form disclosed, but on the contrary, the intention is to cover all modifications, equivalents and alternatives falling within the spirit and scope of the invention as defined by the appended claims.

What is claimed is:

1. A method of processing a semiconductor wafer sliced from a single-crystal ingot and having front and back surfaces and a peripheral edge comprising the steps, in order, of:
   (a) rough grinding the front and back surfaces of the wafer after the wafer is sliced from the single-crystal ingot to quickly reduce the thickness of the wafer;
   (b) lapping the front and back surfaces of the wafer using a lapping slurry to further reduce the thickness of the wafer and reduce damage caused by the rough grinding;
   (c) etching said wafer in a chemical etchant to further reduce the thickness of the wafer;
   (d) polishing the peripheral edge of the wafer; and
   (e) polishing the front surface of the wafer using a polishing slurry to reduce the thickness of the wafer such that the front surface of the wafer is highly reflective and substantially damage-free for subsequently forming devices on the front surface of the wafer and grinding the back surface of the wafer to reduce the thickness of the wafer before dicing the wafer into chips.

2. The method set forth in claim 1 further comprising the step of cleaning the wafer after the lapping operation and before the etching operation to remove particulate material from the wafer caused by the lapping operation.

3. The method set forth in claim 1 wherein the rough grinding step is conducted by placing the wafer in a grinding apparatus, the apparatus including a resin bond type grinding wheel having grains sized in the range of 5–25 microns.

4. The method set forth in claim 3 wherein the grinding apparatus employs circumferential grinding for rough grinding the wafer.

5. The method set forth in claim 3 wherein the step of rough grinding is conducted at a grinding rate in the range of 50–250 microns per minute.

6. The method set forth in claim 5 wherein the rough grinding step reduces the wafer thickness by about 45–75 microns and the lapping step further reduces the wafer thickness by about 15–35 microns.

7. The method set forth in claim 1 wherein the rough grinding step is conducted for a time period less than or equal to about 60 seconds and the lapping step is conducted for a time period of less than or equal to about 10 minutes.

8. The method set forth in claim 1 further comprising the step of fine grinding the front surface of the wafer before polishing the front surface of the wafer.

9. The method set forth in claim 8 wherein the fine grinding is conducted with a grinding apparatus having a resin bond type grinding wheel having grains sized in the range of 2–10 microns.

10. The method set forth in claim 9 wherein the step of fine grinding is conducted at a grinding rate in the range of 15–20 microns per minute.

11. The method set forth in claim 8 wherein the fine grinding step is conducted to quickly reduce the wafer thickness by about 5–15 microns.

12. The method set forth in claim 11 wherein the fine grinding step is conducted for a time period of less than or equal to about five minutes.

13. The method set forth in claim 1 wherein the rough grinding step reduces the wafer thickness by about 55 microns, the lapping step reduces the wafer thickness by about 25 microns, the etching step reduces the wafer thickness by about 25 microns, the fine grinding step reduces the wafer thickness by about 5–15 microns and the polishing step reduces the wafer thickness by about 5–10 microns.

14. A method of processing a semiconductor wafer sliced from a single-crystal ingot and having front and back surfaces and a peripheral edge, the method comprising the steps, in order, of:
   (a) rough grinding the front and back surfaces of the wafer to quickly reduce the thickness of the wafer;
   (b) fine grinding the front surface of the wafer to further reduce the thickness of the wafer and reduce wafer damage caused by the rough grinding;
   (c) polishing the peripheral edge of the wafer to reduce edge damage caused upon being sliced from the single-crystal ingot and by the rough grinding and fine grinding operations; and
   (d) polishing the front surface of the wafer using a polishing slurry.

15. The method set forth in claim 14 further comprising the step of etching the wafer in a chemical etchant before polishing the surface of the first side of the wafer.

16. The method set forth in claim 15 wherein the fine grinding step further comprises fine grinding the surface of the second side of the wafer and the polishing step further comprises polishing the surface of the second side of the wafer using a polishing slurry.

17. A method of processing a semiconductor wafer sliced from a single-crystal ingot and having front and back surfaces and a peripheral edge, the method comprising the steps, in order, of:
   (a) fine grinding the front and back surfaces of the wafer to quickly reduce the thickness of the wafer;
   (b) polishing the peripheral edge of the wafer to reduce edge damage caused upon being sliced from the single-crystal ingot and by the fine grinding operation; and
   (c) polishing the front surface of the wafer using a polishing slurry.

* * * * *